United States Patent
Luong et al.

(10) Patent No.: US 8,501,628 B2
(45) Date of Patent: Aug. 6, 2013

(54) DIFFERENTIAL METAL GATE ETCHING PROCESS

(75) Inventors: Vinh Hoang Luong, Boise, ID (US);
Hiroyuki Takahashi, Tokyo (JP);
Akiteru Ko, Schenectady, NY (US);
Asao Yamashita, Tokyo (JP); Vaidya Bharadwaj, Austin, TX (US); Takashi Enomoto, Rensselaer, NY (US); Daniel J. Prager, Hopewell Junction, NY (US)

(73) Assignee: Tokyo Electron Limited, Tokyo (JP)

( * ) Notice: Subject to any disclaimer, the term of this patent is extended or adjusted under 35 U.S.C. 154(b) by 676 days.

(21) Appl. No.: 12/729,538

(22) Filed: Mar. 23, 2010

(65) Prior Publication Data

US 2011/0237084 A1    Sep. 29, 2011

(51) Int. Cl.
*H01L 21/302* (2006.01)
(52) U.S. Cl.
USPC ............ 438/706; 438/712; 438/720; 438/733
(58) Field of Classification Search
USPC ................... 438/706, 712, 720, 733
See application file for complete search history.

(56) References Cited

U.S. PATENT DOCUMENTS

| 6,531,404 | B1  | 3/2003  | Nallan et al. |
| 6,921,493 | B2* | 7/2005  | Chien et al. ................. 216/67 |
| 7,282,773 | B2  | 10/2007 | Li et al. |
| 7,312,120 | B2  | 12/2007 | Shea |
| 7,368,392 | B2  | 5/2008  | Choi et al. |
| 2003/0151074 | A1* | 8/2003 | Zheng et al. ................. 257/200 |
| 2004/0206724 | A1 | 10/2004 | Nallan et al. |
| 2006/0060565 | A9* | 3/2006 | Nallan et al. ................. 216/67 |
| 2008/0190893 | A1* | 8/2008 | Mori et al. ................... 216/61 |
| 2008/0230519 | A1 | 9/2008  | Takahashi |
| 2009/0004870 | A1* | 1/2009 | Liu et al. ..................... 438/710 |
| 2009/0233446 | A1 | 9/2009  | Sakao et al. |
| 2011/0049582 | A1* | 3/2011 | Johnson et al. ............ 257/288 |

FOREIGN PATENT DOCUMENTS

EP     0924753 A2    6/1999

OTHER PUBLICATIONS

International Searching Authority, International Search Report and Written Opinion, International Application No. PCT/US2011/029210, Mailed May 20, 2011, 14 pages.

* cited by examiner

*Primary Examiner* — Binh X Tran (57) ABSTRACT

A method for etching a differential metal gate structure on a substrate is described. The differential metal gate structure includes a metal gate layer overlying a high dielectric constant (high-k) dielectric layer, wherein the metal gate layer comprises a different thickness at different regions on the substrate. The metal gate layer is patterned by using a plasma etching process, wherein at least one etch step includes forming plasma using a halogen-containing gas and at least one etch step includes forming plasma using an additive gas having as atomic constituents C, H, and F.

20 Claims, 12 Drawing Sheets

DIFFERENTIAL METAL GATE ETCHING PROCESS

CROSS-REFERENCE TO RELATED APPLICATIONS

This application is related to pending U.S. patent application Ser. No. 11/690,256, entitled "METHOD AND SYSTEM FOR DRY ETCHING A METAL NITRIDE" (ES-124), filed on Mar. 23, 2007; and pending U.S. patent application Ser. No. 11/832,382, entitled "METHOD FOR ETCHING METAL NITRIDE WITH HIGH SELECTIVITY TO OTHER MATERIALS" (ES-134), filed on Aug. 1, 2007. The entire content of these applications are herein incorporated by reference in their entirety.

BACKGROUND OF THE INVENTION

1. Field of Invention

The invention relates to a method for etching a metal-containing layer on a substrate using a plasma etching process and, in particular, a method for etching a differential metal gate structure.

2. Description of Related Art

As the size of semiconductor devices is reduced, process development and integration issues are key challenges for new gate stack materials including high-permittivity (or high dielectric constant) dielectric materials (also referred to herein as high-k materials).

Dielectric materials featuring a dielectric constant greater than that of $SiO_2$ (k~3.9) are commonly referred to as high-k materials. In addition, high-k materials may refer to dielectric materials that are deposited onto substrates (e.g., $HfO_2$, $ZrO_2$) rather than grown on the surface of the substrate (e.g., $SiO_2$, $SiN_xO_y$). High-k materials may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)).

For front-end-of-line (FEOL) operations, in the near future, these high-k materials are contemplated for integration with polycrystalline silicon (polysilicon) gate structures and, in the longer term, they are contemplated for use with metal gates. However, the integration of high-k materials with polysilicon gate structures generally requires the insertion of a thin layer, such as a metal nitride, between the high-k layer and the polysilicon layer, where the thin layer may act as a barrier layer. This material must be etched while minimizing damage to the gate structure, etc. Furthermore, metal nitrides are contemplated for use in metal gates, and must be etched while minimizing damage to the underlying structure.

Of course, many other needs exist in semiconductor processing for etching a metal containing layer. One example includes etching portions of a metal containing barrier layer in a contact or via during metallization processes for back-end-of-line (BEOL) operations. Another example includes etching portions of metal containing layers in capacitors for DRAM production.

SUMMARY OF THE INVENTION

The invention relates to a method for etching a metal-containing layer on a substrate using a plasma etching process and, in particular, a method for etching a dual metal gate structure.

According to one embodiment, a method for performing a differential metal gate etching process is described. The method comprises disposing a substrate in a plasma processing system, wherein the substrate has a differential metal gate structure. The differential metal gate structure includes a metal gate layer overlying a high dielectric constant (high-k) dielectric layer, wherein the metal gate layer comprises a first thickness for a first region on the substrate and a second thickness for a second region on the substrate, and wherein the second thickness is greater than the first thickness. The method further comprises performing a differential metal gate etching process for pattern etching the metal gate layer through the first thickness at the first region and the second thickness at the second region. The differential metal gate etching process comprises at least one etch step that includes forming plasma using a halogen-containing gas and at least one etch step that includes forming plasma using an additive gas having C, H, and F as atomic constituents.

According to another embodiment, a method for performing a differential metal gate etching process is described. The method comprises disposing a substrate in a plasma processing system, wherein the substrate has a differential metal gate structure. The differential metal gate structure includes a metal gate layer overlying a high dielectric constant (high-k) dielectric layer, wherein the metal gate layer comprises a first thickness for a first region on the substrate and a second thickness for a second region on the substrate, and wherein the second thickness is greater than the first thickness. The method comprises performing a differential metal gate etching process for pattern etching the metal gate layer through the first thickness at the first region and the second thickness at the second region using a plurality of etch steps. The method further comprises substantially eliminating a footing in the metal gate layer at the second region by introducing an additive gas having C, H, and F as atomic constituents to at least one etch step in the plurality of etch steps.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, pattern etching can comprise the application of a thin layer of radiation-sensitive material, such as photo-resist, to an upper surface of a substrate, followed by patterning of the thin layer of material using lithographic techniques. During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Using a series of dry etching processes, the pattern formed in the thin layer of radiation-sensitive material is transferred to the underlying layers within a film stack, including the one or more material layers that are desired for the end product, e.g., electronic device.

Figure 1A:
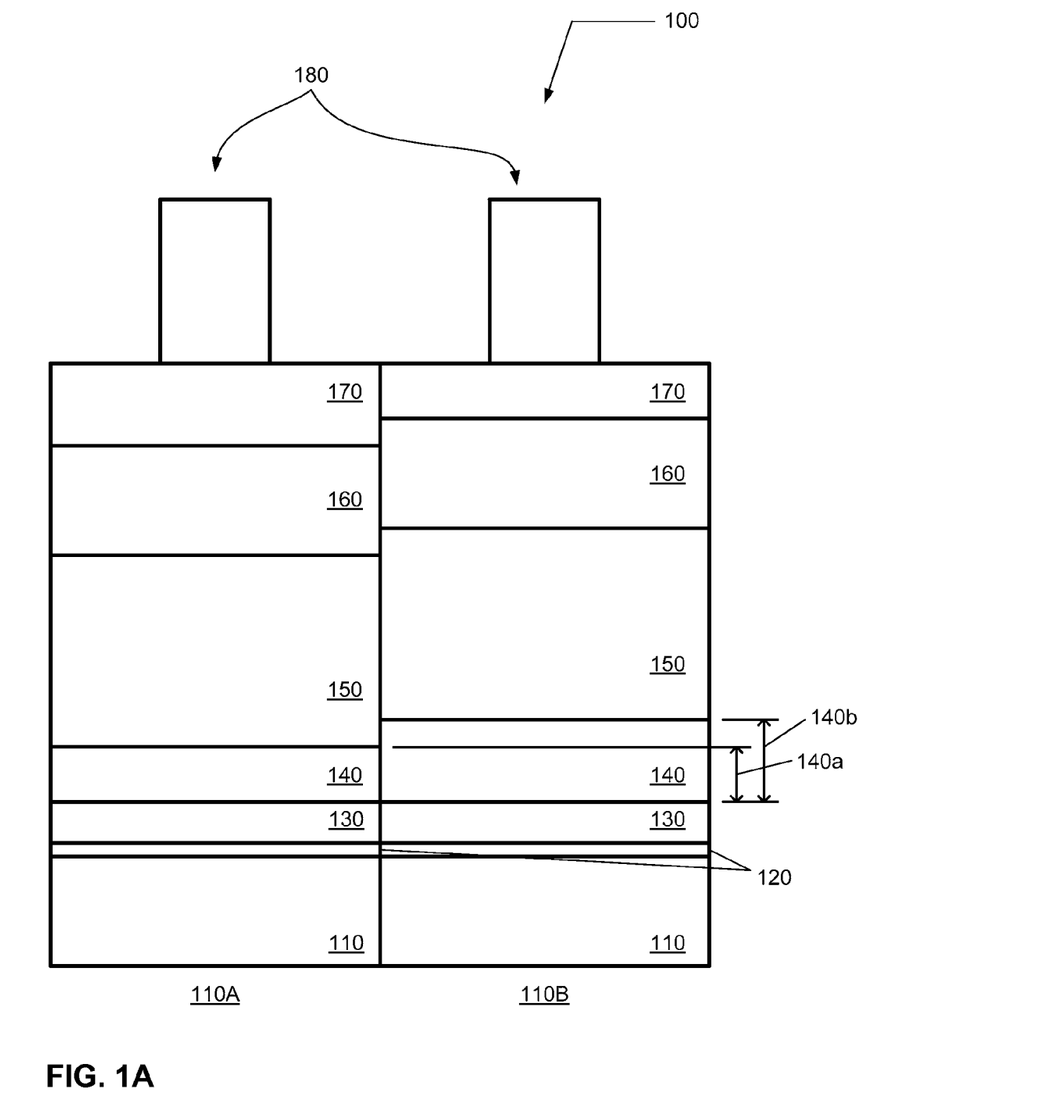
FIGS. 1A through 1C illustrate a schematic representation of a procedure for etching a feature pattern in a substrate.
Figure 1B:
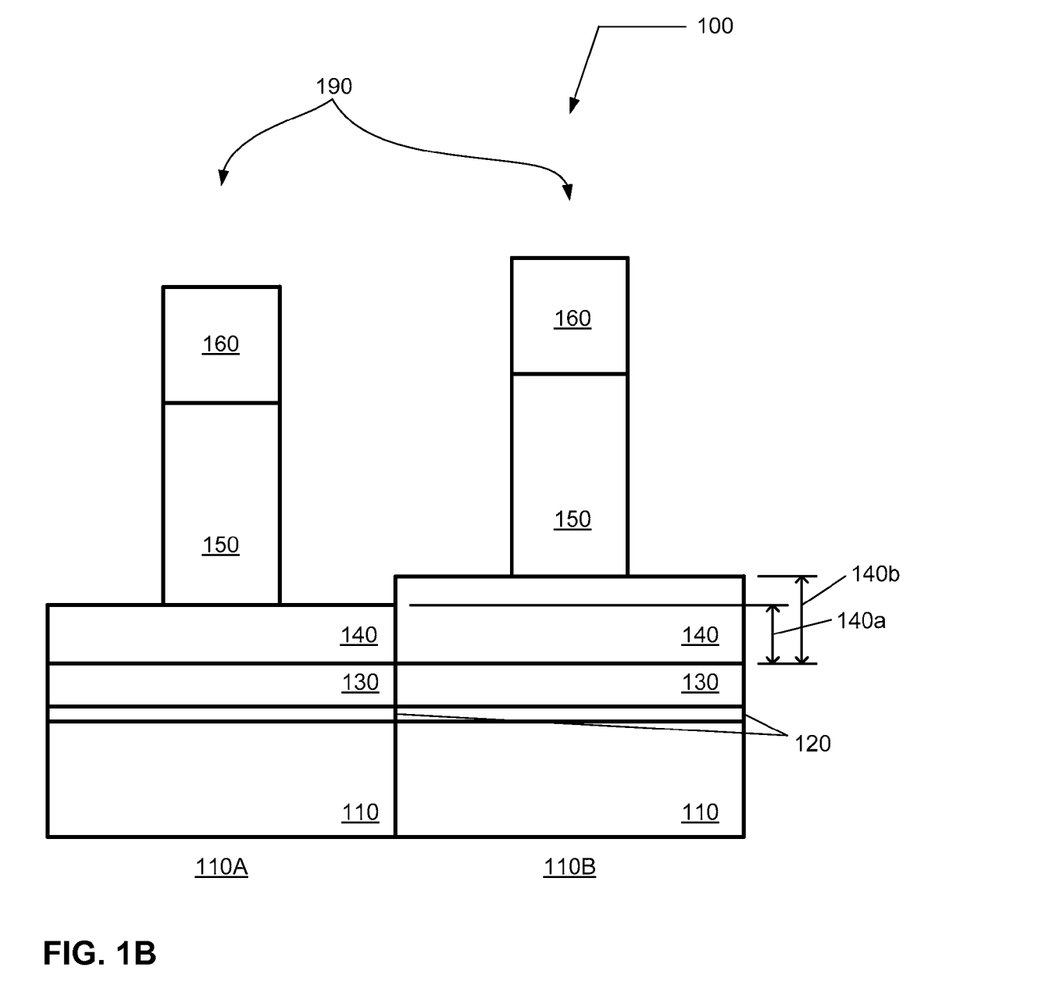
Figure 1C:
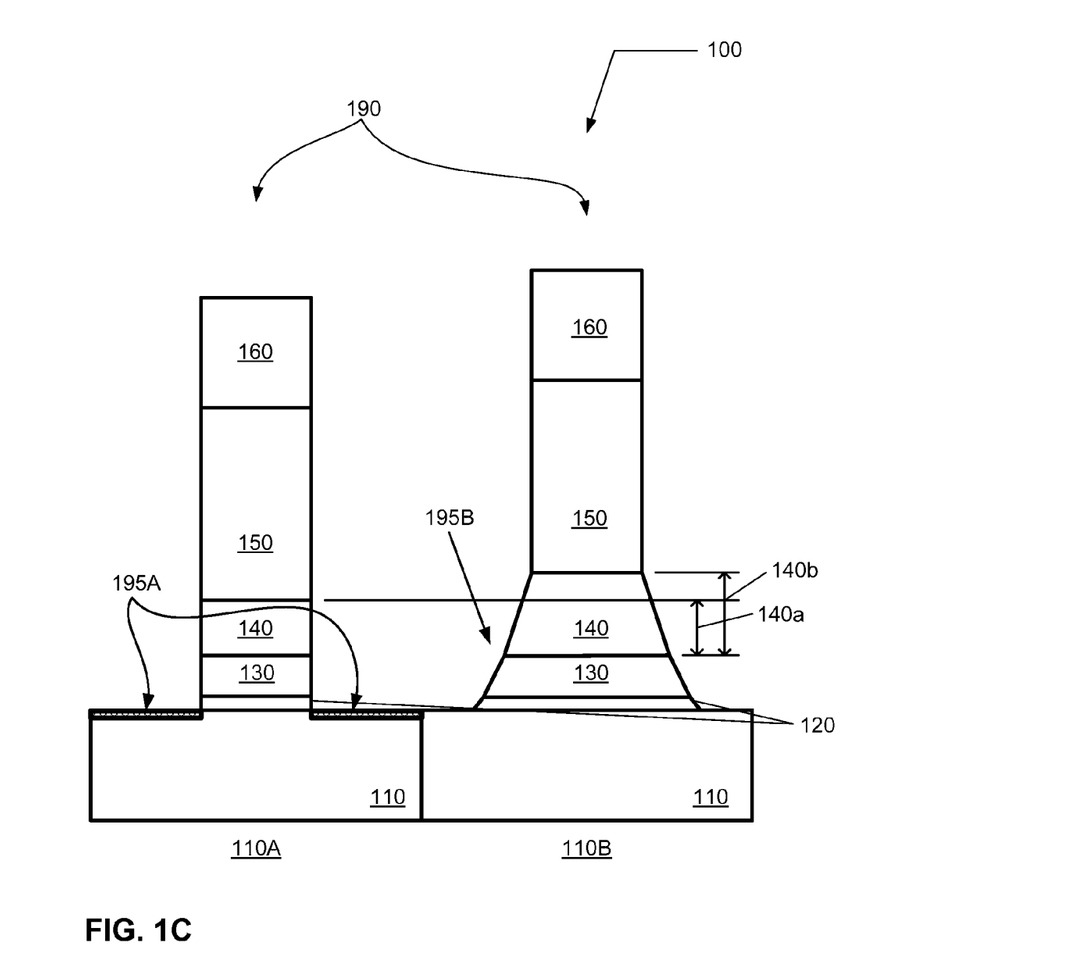

For example, as shown in FIGS. 1A through 1C, a differential metal gate structure 100 is prepared, wherein the differential metal gate structure 100 begins with forming a film stack having a plurality of layers (i.e., layers 120 through 170) on a substrate 110. The differential metal gate structure 100 may, for example, include a polycrystalline silicon (polysilicon, or poly-Si) gate having a polysilicon layer 150, a metal gate layer 140, and a high dielectric constant (high-k) dielectric layer 130 as the gate dielectric or part of the gate dielectric. Alternatively, the differential metal gate structure 100 may, for example, include a tungsten-containing layer to replace polysilicon layer 150, a metal gate layer 140, and a high-k dielectric layer 130 as the gate dielectric or part of the gate dielectric.

The metal gate layer 140 may, for example, be part of a poly-Si gate electrode. The metal gate layer 140 may be several hundred Angstroms (Å) thick, for instance, about 100 Å thick, and it may comprise a metal, a metal alloy, a metal nitride, or a metal oxide. For example, metal gate layer 140 can contain titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. The metal gate layer 140 in the gate electrode can replace or be integrated with the traditional poly-Si gate electrode layer.

As shown in FIG. 1A, the metal gate layer 140 of the differential metal gate structure 100 comprises a first thickness 140a for a first region 110A on the substrate 110 and a second thickness 140b for a second region 110B on the substrate 110. The first thickness 140a and the second thickness 140b are different and, as illustrated in FIG. 1A, the second thickness 140b is greater than the first thickness 140a. The first thickness 140a of the metal gate layer 140 at the first region 110A may correspond to an nFET (negative channel field effect transistor) device, and the second thickness 140b of the metal gate layer 140 at the second region 110B may correspond to a pFET (positive channel FET) device.

As illustrated in FIG. 1A, the gate dielectric may further include an interfacial layer 120, such as a thin layer of silicon dioxide ($SiO_2$) between the high-k dielectric layer 130 and the substrate 110. The high-k dielectric layer 130 may, for example, comprise a lanthanum-containing layer, such as lanthanum oxide (LaO), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k dielectric layer 130 may incorporate metallic silicates or oxides (e.g., $Ta_2O_5$ (k~26), $TiO_2$ (k~80), $ZrO_2$ (k~25), $Al_2O_3$ (k~9), HfSiO, $HfO_2$ (k~25)). Furthermore, for example, the high-k dielectric layer 130 may include mixed rare earth oxides, mixed rare earth aluminates, mixed rare earth nitrides, mixed rare earth aluminum nitrides, mixed rare earth oxynitrides, or mixed rare earth aluminum oxynitrides.

The differential metal gate structure 100 further comprises a patterned mask layer 180, such as a layer of radiation-sensitive material or photo-resist having a pattern formed therein using a photo-lithographic process or other lithographic process (e.g., electron beam lithography, imprint lithography, etc.). Additionally, for example, the differential metal gate structure 100 may include an anti-reflective coating (ARC) layer 170 for use in patterning the mask layer 180, one or more soft mask layers, one or more organic planarization layers (OPL) or organic dielectric layers (ODL), and/or one or more hard mask layers 160, such as a silicon dioxide ($SiO_2$) hard mask for dry etching the polysilicon layer 150.

As illustrated in FIGS. 1B and 1C, the series of etching processes for transferring the pattern (defined by the patterned mask layer 180) to the underlying stack of films to form patterned differential metal gate 190 is selected to preserve the integrity of the pattern being transferred, e.g., critical dimensions, etc., as well as minimize damage to those layers which are utilized in the electronic device being fabricated.

However, as illustrated in FIG. 1C, the patterning of metal gate layer 140, high-k dielectric layer 130, and interfacial layer 120 may cause damage to substrate 110 at surface regions 195A proximate the first region 110A and/or creation of a metal/high-k footing 195B proximate the second region 110B.

Conventional pattern etching chemistries do not provide adequate etch selectivity between the metal gate layer 140 and the high-k dielectric layer 130. Therefore, when the pattern etching process breaks through the (thinner) metal gate layer 140 at first region 110A having first thickness 140a prior to breaking through the (thicker) metal gate layer 140 at second region 110B having second thickness 140b, the high-k dielectric layer 130 and interfacial layer 120 are prematurely consumed at first region 110A and the surface regions 195A of substrate 110 at first region 110A are exposed to the plasma etching chemistry for a prolonged period of time. In order to reduce or prevent under-cutting of the high-k dielectric layer 130, the metal gate layer 140, and/or the polysilicon layer 150 at the first region 110A, the plasma etching process must be terminated prematurely, thus, leaving behind the high-k/metal gate footing 195B proximate the second region 110B.

Figure 2:
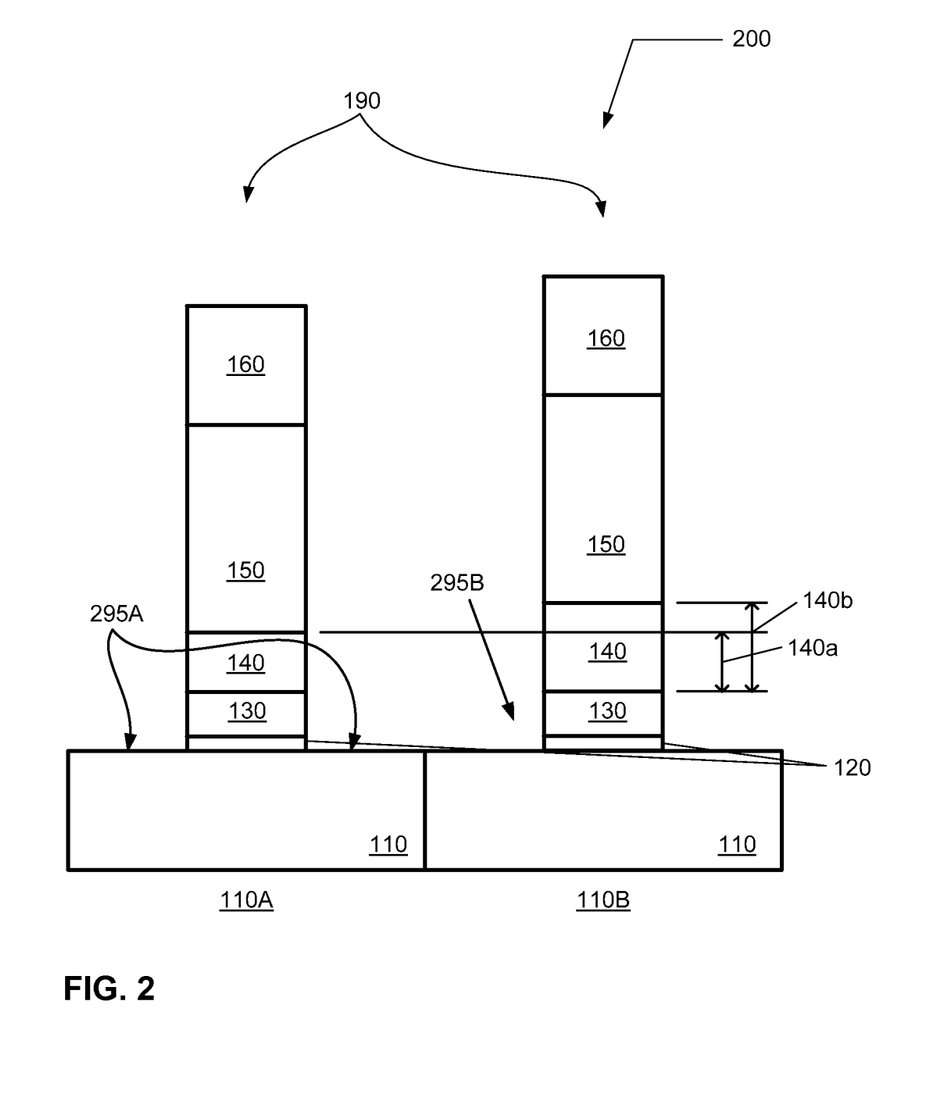
FIG. 2 illustrate a schematic representation of a procedure for etching a feature pattern in a substrate according to an embodiment.

Therefore, according to an embodiment, a method for performing a differential metal gate etching process to prepare a differential metal gate structure 200 is illustrated in FIG. 2. The method comprises substantially eliminating a footing in a base region 295B of the metal gate layer 140 (and high-k dielectric layer 130) at the second region 110B, while substantially eliminating (silicon) damage to a silicon-containing layer (e.g., substrate 110) in a base region 295A underlying the high-k dielectric layer 130 at the first region 110A. The method comprises inserting at least one selective etch step (i.e., selective between the metal gate layer 140 and the high-k dielectric layer 130) into the differential metal gate etch process.

Figure 3:
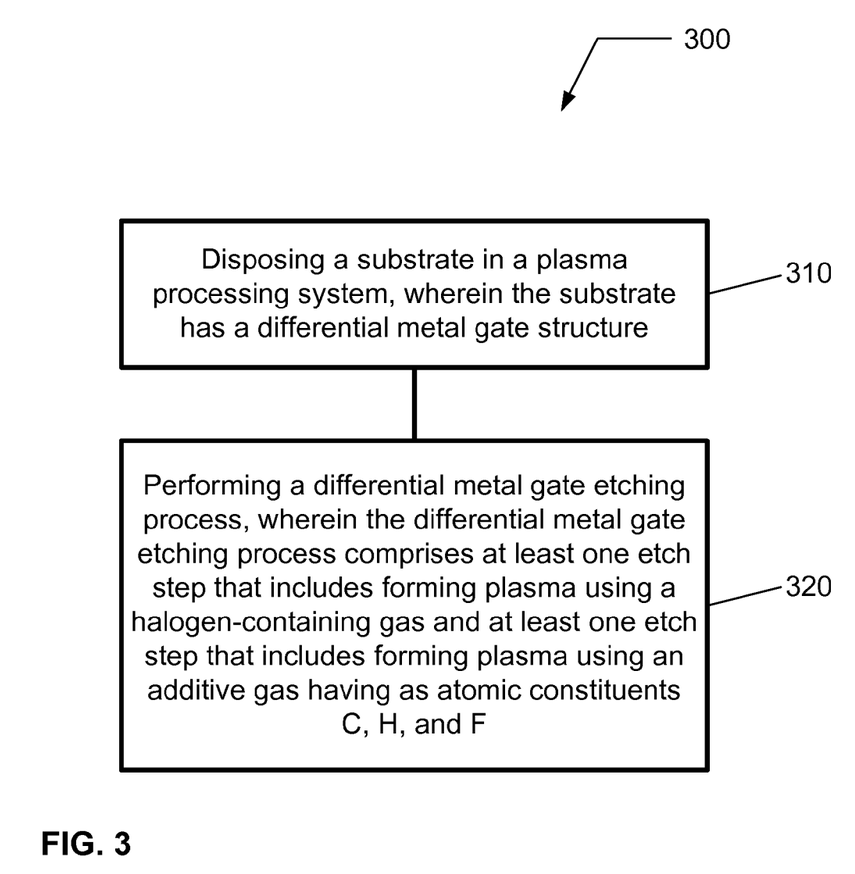
FIG. 3 provides a flow chart illustrating a method of etching a feature in a substrate according to an embodiment.

Referring now to FIG. 3, a method for performing a differential metal gate etching process is further described according to another embodiment. The method comprises a flow chart 300 beginning in 310 with disposing a substrate in a plasma processing system, wherein the substrate has a differential metal gate structure. Referring to FIG. 1A, the differential metal gate structure includes metal gate layer 140 overlying high-k dielectric layer 130, wherein the metal gate layer 140 comprises first thickness 140$a$ for first region 110A on the substrate 110 and second thickness 140$b$ for second region 110B on the substrate 110, and wherein the second thickness 140$b$ is greater than the first thickness 140$a$.

In 320, the method further comprises performing a differential metal gate etching process for pattern etching the metal gate layer 140 through the first thickness 140$a$ at the first region 110A and through the second thickness 140$b$ at the second region 110B. The differential metal gate etching process comprises at least one etch step that includes forming plasma using a halogen-containing gas and at least one etch step that includes forming plasma using an additive gas having C, H, and F as atomic constituents.

The halogen-containing gas can include one or more gases selected from the group consisting of $Cl_2$, HBr, and $BCl_3$. Furthermore, the additive gas can include one or more gases selected from the group consisting of $CH_2F_2$ and $CHF_3$.

In one embodiment, the differential metal gate etching process comprises: performing a first etch step that includes pattern etching the metal gate layer 140 using plasma formed from a process composition containing a halogen-containing gas; and following the first etch step, performing a selective etch step that includes pattern etching the metal gate layer 140 using plasma formed from a process composition containing a halogen-containing gas and an additive gas having the chemical formula $C_xH_yF_z$, where x, y and z are equal to unity or greater.

The first etch step proceeds for a time duration sufficient to etch through the metal gate layer 140 for at least a portion of the first region 110A, and the selective etch step proceeds for a time duration sufficient to fully complete the pattern etching of the metal gate layer 140 for the first region 110A and the second region 110B. The time duration for the first etch step may be determined in-situ using endpoint detection or it may be determined prior to performing the first etch step. The time duration for the selective etch step may be determined prior to performing the selective etch step or it may be determined in-situ using endpoint detection.

As an example, the first etch step may utilize plasma formed of a process composition containing $Cl_2$, and the selective etch step may utilize plasma formed of a process composition containing $Cl_2$ and $CHF_3$. The process composition in the first etch step and the selective etch step may further include $N_2$ and/or Ar. The process pressure may be varied between the first etch step and the selective etch step, or it may be kept constant.

In additional embodiments, the differential metal gate etching process comprises: performing a first etch step that includes pattern etching the metal gate layer 140 using plasma formed from a process composition containing a halogen-containing gas; and following the first etch step, performing a selective etch step that includes pattern etching the metal gate layer 140 using plasma formed from a process composition containing a halogen-containing gas and an additive gas having the chemical formula $C_xH_yF_z$, where x, y and z are equal to unity or greater. Following the first etch step, and either preceding or following the selective etch step, a second etch step is performed that includes pattern etching the metal gate layer 140 using plasma formed from a process composition containing a halogen-containing gas.

Therein, in one embodiment, the first etch step proceeds for a time duration sufficient to etch through the metal gate layer 140 for at least a portion of the first region 110A, the selective etch step proceeds for a time duration sufficient to fully complete the pattern etching of the metal gate layer 140 for the first region 110A (i.e., "break-through" the metal gate layer 140 at the first region 110A), and the second etch step follows the selective etch step and proceeds for a time duration sufficient to fully complete the pattern etching of the metal gate layer 140 for the second region 110B.

Therein, in another embodiment, the first etch step proceeds for a time duration sufficient to etch through the metal gate layer 140 for at least a portion of the first region 110A, the second etch step precedes the selective etch step and proceeds for a time duration sufficient to complete the pattern etching of the metal gate layer 140 for the first region 110A and at least a portion of the second region 110B, and the selective etch step proceeds for a time duration sufficient to fully complete the pattern etching of the metal gate layer 140 for the first region 110A and the second region 110B (i.e., "trim" the metal gate layer 140 at the second region 110B).

The time duration for the first etch step may be determined in-situ using endpoint detection, or it may be determined prior to the first etch step. The time duration for the second etch step may be determined prior to performing said second etch step, or it may be determined using endpoint detection. The time duration for the selective etch step may be determined prior to performing the selective etch step, or it may be determined using endpoint detection.

As an example, the first etch step may utilize plasma formed of a process composition containing $Cl_2$, the second etch step may utilize plasma formed of a process composition containing $Cl_2$, and the selective etch step may utilize plasma formed of a process composition containing $Cl_2$ and $CHF_3$. The process composition in the first etch step, the second etch step, and the selective etch step may further include $N_2$ and/or Ar. The process pressure may be varied between the first etch step, the second etch step, and the selective etch step, or it may be kept constant between two or more steps.

Figure 4:
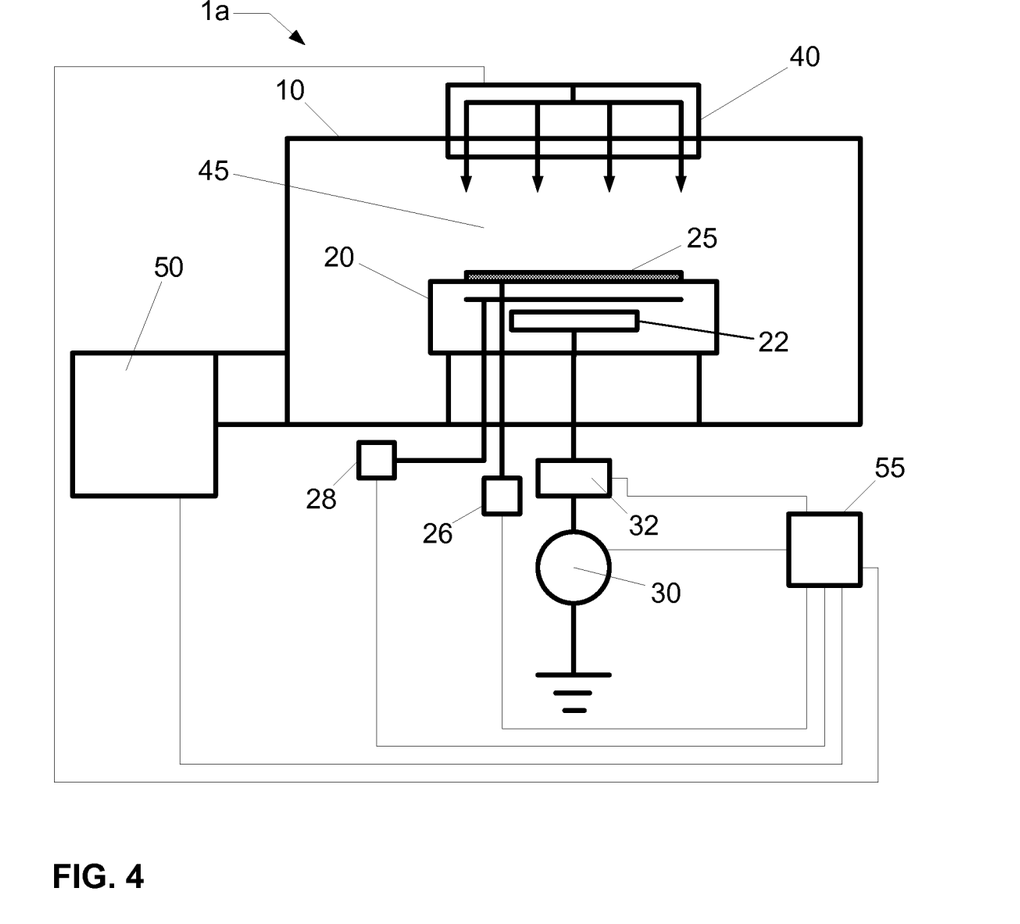
FIG. 4 shows a schematic representation of a processing system according to an embodiment.

According to one embodiment, a plasma processing system 1$a$ configured to perform the above identified process conditions is depicted in FIG. 4 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 4, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 5, plasma processing system 1b can be similar to the embodiment of FIG. 4 and further comprise either a stationary, or mechanically or electrically rotating magnetic field system 60, in order to potentially increase plasma density and/or improve plasma processing uniformity, in addition to those components described with reference to FIG. 4. Moreover, controller 55 can be coupled to magnetic field system 60 in order to regulate the speed of rotation and field strength. The design and implementation of a rotating magnetic field is well known to those skilled in the art.

Figure 5:
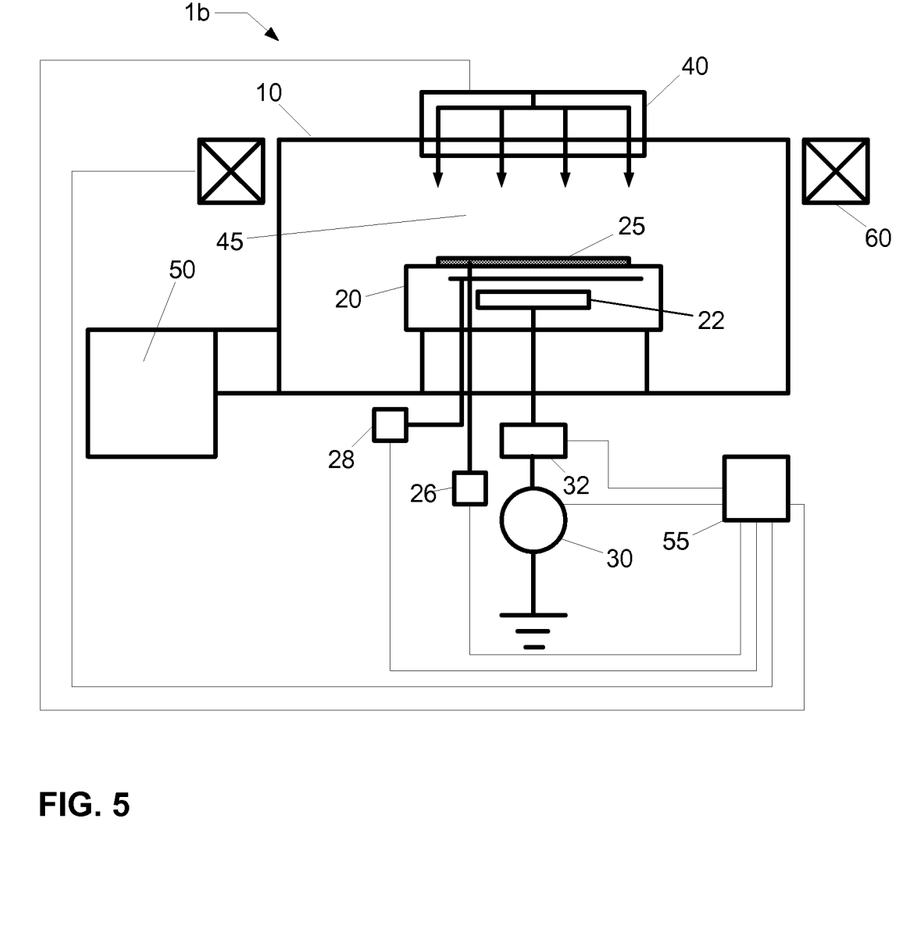
FIG. 5 shows a schematic representation of a processing system according to another embodiment.
Figure 6:
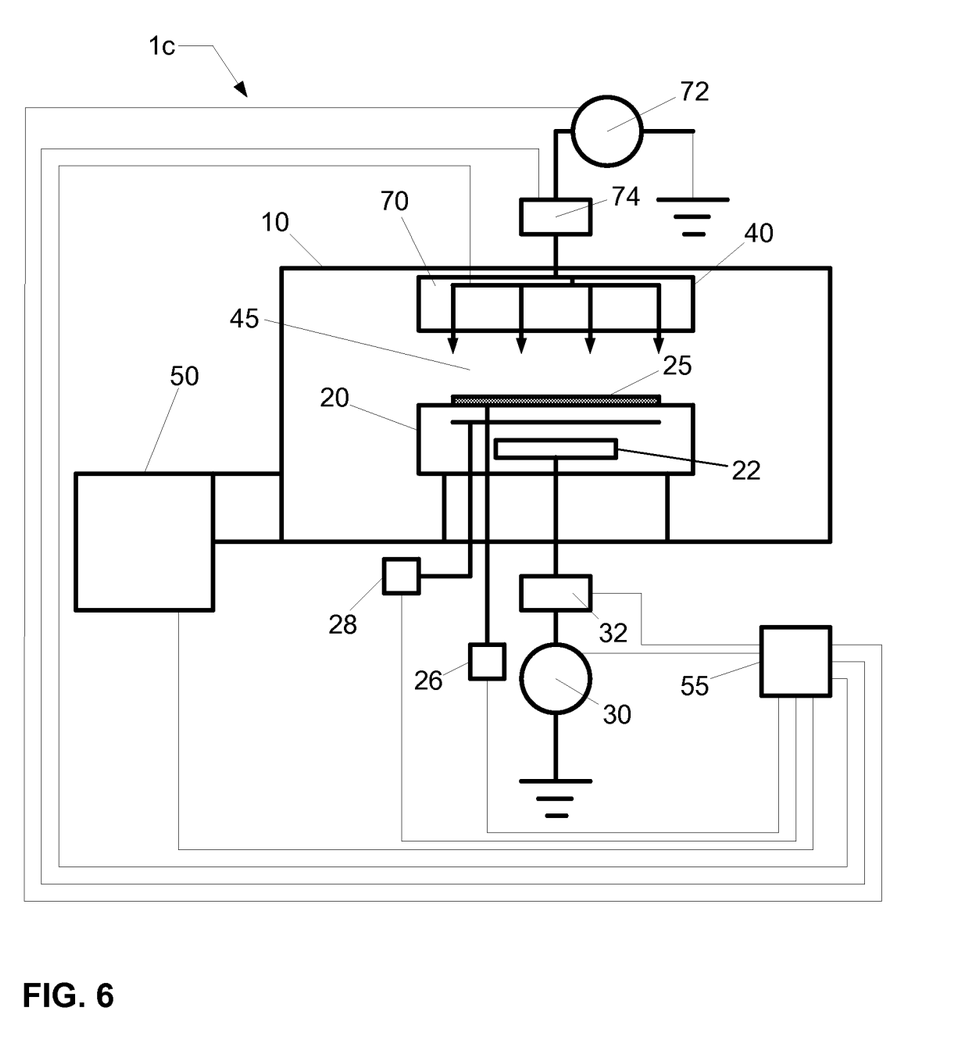
FIG. 6 shows a schematic representation of a processing system according to another embodiment.

In the embodiment shown in FIG. 6, plasma processing system 1c can be similar to the embodiment of FIG. 4 or FIG. 5, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 7:
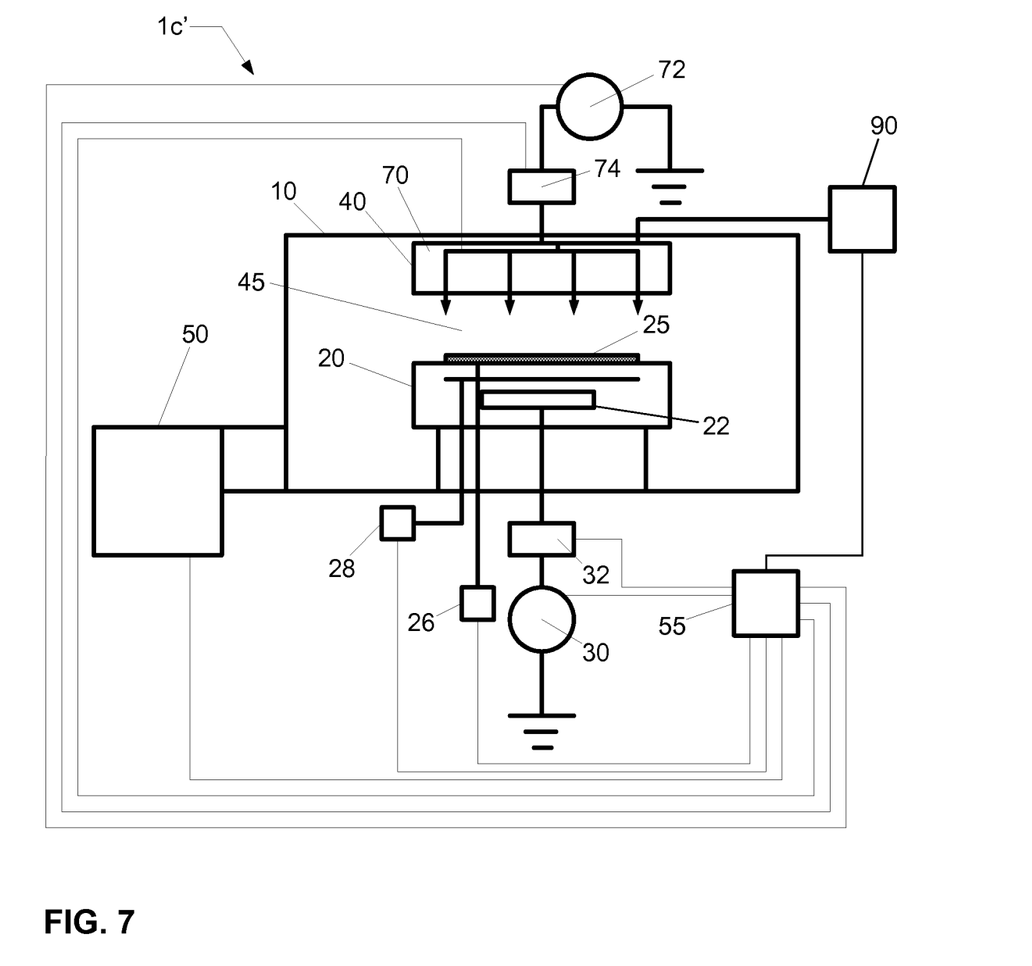
FIG. 7 shows a schematic representation of a processing system according to another embodiment.

In the embodiment shown in FIG. 7, plasma processing system 1c' can be similar to the embodiment of FIG. 6, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 8:
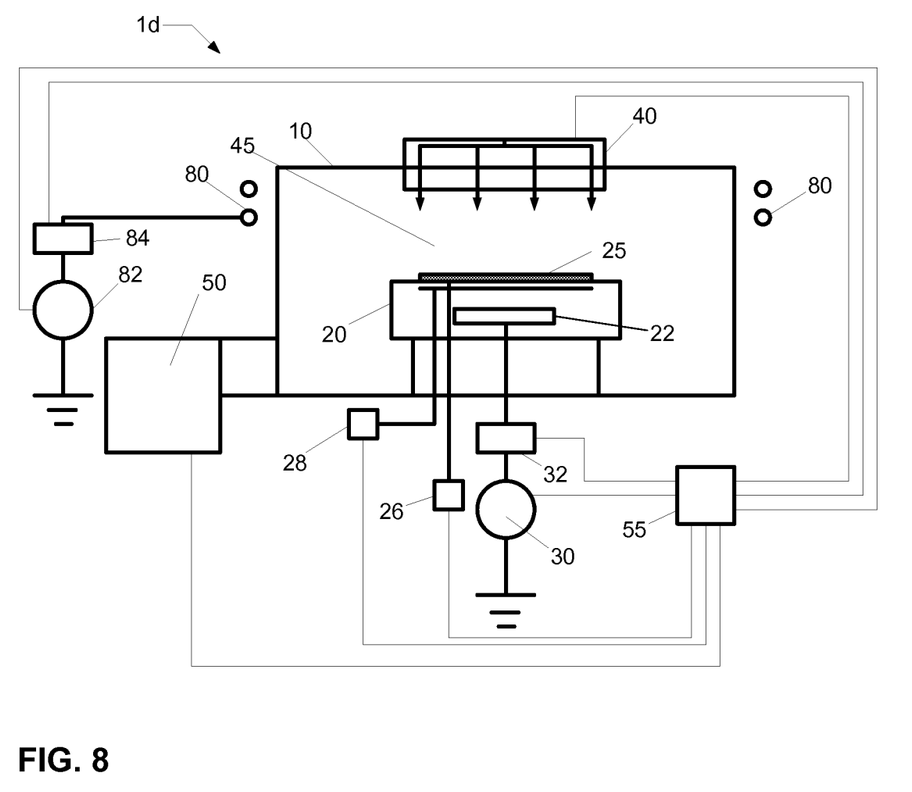
FIG. 8 shows a schematic representation of a processing system according to another embodiment.

In the embodiment shown in FIG. 8, plasma processing system 1d can be similar to the embodiments of FIGS. 4 and 5, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 9:
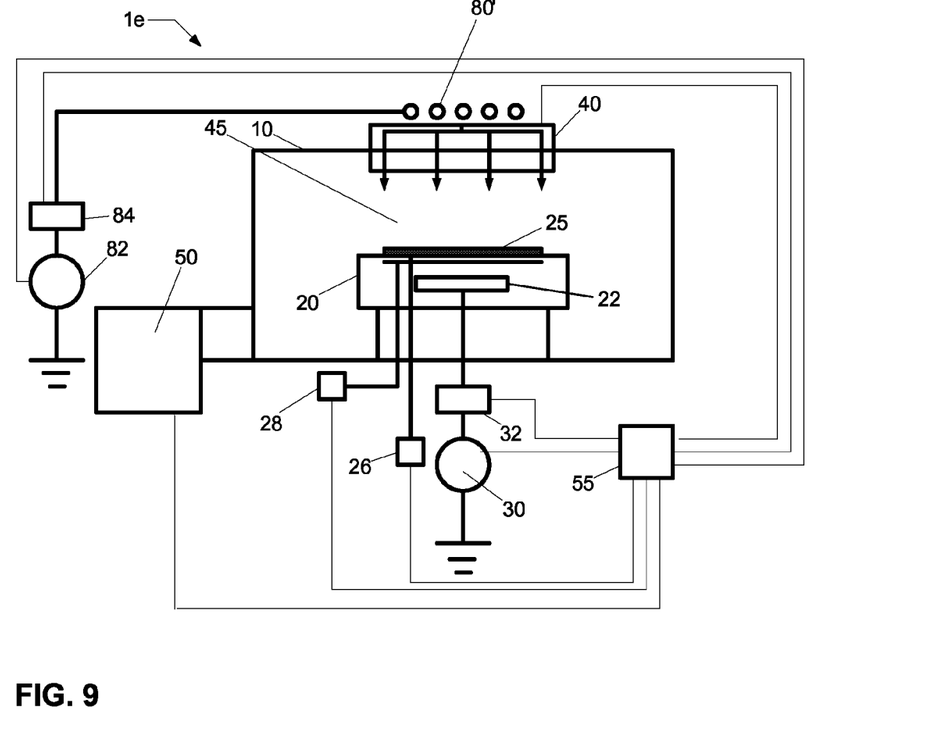
FIG. 9 shows a schematic representation of a processing system according to another embodiment.

In an alternate embodiment, as shown in FIG. 9, plasma processing system 1e can be similar to the embodiment of FIG. 8, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 10:
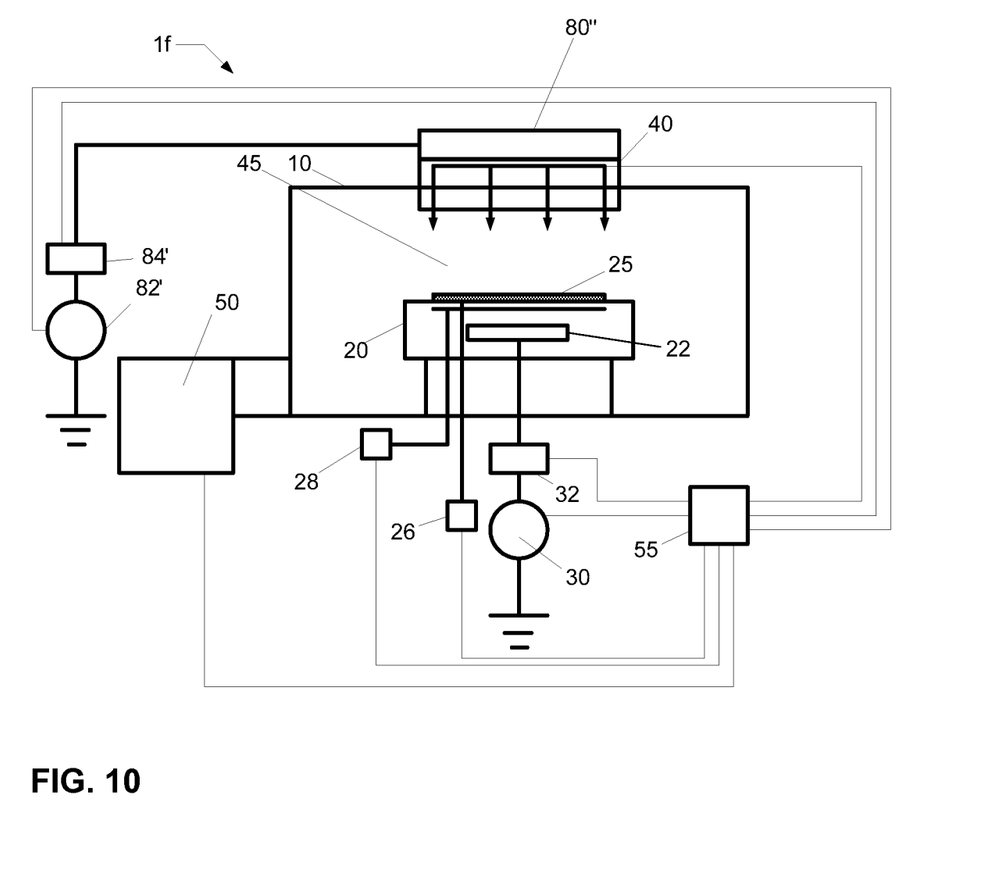
FIG. 10 shows a schematic representation of a processing system according to another embodiment.

In the embodiment shown in FIG. 10, plasma processing system 1f can be similar to the embodiment of FIG. 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In one embodiment, the differential metal gate etching process may comprise a process parameter space for the first etch step, the second etch step, and/or the selective etch step that includes: a chamber pressure ranging up to about 1000 mtorr (millitorr) (e.g., up to about 100 mtorr, or up to about 10 to 30 mtorr), a halogen-containing gas process gas flow rate ranging up to about 2000 sccm (standard cubic centimeters per minute) (e.g., up to about 1000 sccm, or about 1 sccm to about 100 sccm, or about 1 sccm to about 20 sccm, or about 15 sccm), an additive gas process gas flow rate ranging up to about 2000 sccm (e.g., up to about 1000 sccm, or about 1 sccm to about 20 sccm, or about 10 sccm), an upper electrode (e.g., element 70 in FIG. 6) RF bias ranging up to about 2000 W (watts) (e.g., up to about 1000 W, or up to about 500 W), and a lower electrode (e.g., element 22 in FIG. 6) RF bias ranging up to about 1000 W (e.g., up to about 600 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

In another alternate embodiment, RF power is supplied to the upper electrode and not the lower electrode. In another alternate embodiment, RF power is supplied to the lower electrode and not the upper electrode. In alternate embodiments, RF power and/or DC power may be coupled in any of the manners described through FIGS. 4 to 10.

The time duration to perform a specific etch step may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

One or more of the etch steps described above may be performed utilizing a plasma processing system such as the one described in FIG. 6. However, the methods discussed are not to be limited in scope by this exemplary presentation.

As noted above, the present inventors discovered that using a differential metal gate etching process using a plurality of etch steps, wherein at least one step utilizes plasma formed of a process composition containing a halogen-containing gas and at least one etch step utilizes plasma formed from a process composition containing a halogen-containing gas and an additive gas having C, H, and F as atomic constituents can provide adequate etch selectivity between the metal gate layer and the underlying high-k dielectric layer. In doing so, the observance of a metal gate/high-k footing may be removed, while damage to the underlying substrate may be reduced or minimized.

Table 1 provides exemplary process conditions for four (4) differential metal gate etch processes. The first etch process (A) in Table 1 corresponds to a two-step etch process that utilizes plasma formed of a process composition containing a halogen containing gas in each step; however, omits use of plasma formed of a process composition containing an additive gas having C, H, and F as atomic constituents in each step. The remaining etch processes (B)-(D) in Table 1 correspond to multi-step etch processes according to various embodiments described above, wherein at least one step utilizes plasma formed of a process composition containing a halogen-containing gas and at least one etch step utilizes plasma formed from a process composition containing a halogen-containing gas and an additive gas having C, H, and F as atomic constituents.

TABLE 1

| Process Description | Process step | UEL RF (W) | LEL RF (W) | p (mTorr) | T (° C.) (UEL, W, LEL-C, LEL-E) | $Cl_2$ (sccm) | Ar (sccm) | $N_2$ (sccm) | $CHF_3$ (sccm) | Etch time (sec) | Metal gate/high-k footing | Silicon damage |
|---|---|---|---|---|---|---|---|---|---|---|---|---|
| (A) Differential metal gate etch process | 1 | 200 | 50 | 10 | 80, 60, 70, 65 | 9 | 200 | 15 | 0 | | Observed | Observed |
| | 2 | 200 | 50 | 20 | 80, 60, 70, 65 | 10.5 | 200 | 15 | 0 | | | |
| (B) Selective differential metal gate etch process | 1 | 200 | 50 | 10 | 80, 60, 70, 65 | 9 | 200 | 15 | 0 | EPT | Not Observed | Not Observed |
| | 2 | 200 | 50 | 20 | 80, 60, 70, 65 | 10.5 | 200 | 15 | 8 | 35 | | |
| (C) Selective differential metal gate etch process | 1 | 200 | 50 | 10 | 80, 60, 70, 65 | 9 | 200 | 15 | 0 | EPT | | |
| | 2 | 200 | 50 | 20 | 80, 60, 70, 65 | 10.5 | 200 | 15 | 8 | 10 | | |
| | 3 | 200 | 50 | 20 | 80, 60, 70, 65 | 10.5 | 200 | 15 | 0 | 70 | | |
| (D) Selective differential metal gate etch process | 1 | 200 | 50 | 10 | 80, 60, 70, 65 | 9 | 200 | 15 | 0 | EPT | | |
| | 2 | 200 | 50 | 20 | 80, 60, 70, 65 | 10.5 | 200 | 15 | 0 | 70 | | |
| | 3 | 200 | 50 | 20 | 80, 60, 70, 65 | 10.5 | 200 | 15 | 8 | 10 | | |

The process compositions for the four (4) differential metal gate etch processes are as follows: (A)(Step 1) $Cl_2$, Ar, $N_2$, and (Step 2) $Cl_2$, Ar, $N_2$; (B) (Step 1) $Cl_2$, Ar, $N_2$, and (Step 2) $Cl_2$, Ar, $N_2$, $CHF_3$; (C) (Step 1) $Cl_2$, Ar, $N_2$, (Step 2) $Cl_2$, Ar, $N_2$, $CHF_3$, and (Step 3) $Cl_2$, Ar, $N_2$; and (D) (Step 1) $Cl_2$, Ar, $N_2$, (Step 2) $Cl_2$, Ar, $N_2$, and (Step 3) $Cl_2$, Ar, $N_2$, $CHF_3$.

For each etch process, a process condition is recited including an order for the etch steps in each etch process, an upper electrode (UEL) power (watts, W), a lower electrode (LEL) power (watts, W), a gas pressure (millitorr, mtorr) in the plasma processing chamber, a temperature set for components in the plasma processing chamber (° C.) ("UEL"=Upper electrode temperature; "W"=Wall temperature; "LEL-C"=Lower electrode center temperature; "LEL-E"=Lower electrode edge temperature), a $Cl_2$ flow rate (standard cubic centimeters per minute, sccm), an Ar flow rate, an $N_2$ flow rate, a $CHF_3$ flow rate, and etch time (sec, seconds) ("EPT"=Endpoint detection used to determine endpoint).

When using the first differential metal gate etch process (A), SEM (scanning electron microscope) images indicated that a metal gate/high-k footing was present (i.e., "Observed") along with silicon damage (e.g., see FIG. 1C). When using the second differential metal gate etch process (B), SEM images indicated that a metal gate/high-k footing was not present (i.e., "Not Observed"), and silicon damage also was not present (e.g., see FIG. 2).

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a metal gate structure, other process flows are contemplated. Accordingly, all such modifications are intended to be included within the scope of this invention.

The invention claimed is:

1. A method for performing a differential metal gate etching process, comprising:

disposing a substrate in a plasma processing system, said substrate having a differential metal gate structure including a metal gate layer overlying a high dielectric constant (high-k) dielectric layer, wherein said metal gate layer comprises a first thickness for a first region on said substrate and a second thickness for a second region on said substrate, said second thickness being greater than said first thickness; and performing a differential metal gate etching process for pattern etching said metal gate layer through said first thickness at said first region and said second thickness at said second region, wherein said differential metal gate etching process comprises at least one etch step that includes forming plasma using a halogen-containing gas and at least one etch step that includes forming plasma using an additive gas having C, H, and F as atomic constituents.

2. The method of claim 1, wherein said first thickness of said metal gate layer at said first region corresponds to an nFET device, and said second thickness of said metal gate layer at said second region corresponds to a pFET device.

3. The method of claim 1, wherein said metal gate layer comprises one or more elements selected from the group consisting of Ti, Ta, and Al, and said high-k dielectric layer comprises one or more elements selected from the group consisting of Hf and La.

4. The method of claim 1, wherein said metal gate layer comprises titanium nitride, and said high-k dielectric layer comprises hafnium dioxide ($HfO_2$), hafnium silicate (HfSiO), or nitrided hafnium silicate (HfSiO(N)), or any combination of two or more thereof.

5. The method of claim 1, wherein said halogen-containing gas includes one or more gases selected from the group consisting of $Cl_2$, HBr, and $BCl_3$.

6. The method of claim 1, wherein said additive gas includes one or more gases selected from the group consisting of $CH_2F_2$ and $CHF_3$.

7. The method of claim 1, wherein said differential metal gate etching process comprises:

performing a first etch step that includes pattern etching said metal gate layer using plasma formed from a process composition containing a halogen-containing gas; and following said first etch step, performing a selective etch step that includes pattern etching said metal gate layer using plasma formed from a process composition containing a halogen-containing gas and an additive gas having the chemical formula $C_xH_yF_z$, where x, y and z are equal to unity or greater.

8. The method of claim 7, wherein said first etch step proceeds for a time duration sufficient to etch through said metal gate layer for at least a portion of said first region, and said selective etch step proceeds for a time duration sufficient to fully complete said pattern etching of said metal gate layer for said first region and said second region.

9. The method of claim 7, wherein said time duration for said first etch step is determined in-situ using endpoint detection and said time duration for said selective etch step is determined prior to performing said selective etch step.

10. The method of claim 7, wherein said selective etch step proceeds at a process pressure greater than said first etch step.

11. The method of claim 7, wherein said first etch step utilizes plasma formed of a process composition containing $Cl_2$, and said selective etch step utilizes plasma formed of a process composition containing $Cl_2$ and $CHF_3$.

12. The method of claim 11, wherein said process composition in said first etch step and said selective etch step further include $N_2$ and Ar.

13. The method of claim 7, further comprising:
following said first etch step, and either preceding or following said selective etch step, performing a second etch step that includes pattern etching said metal gate layer using plasma formed from a process composition containing a halogen-containing gas.

14. The method of claim 13, wherein said first etch step proceeds for a time duration sufficient to etch through said metal gate layer for at least a portion of said first region, said selective etch step proceeds for a time duration sufficient to fully complete said pattern etching of said metal gate layer for said first region, and said second etch step follows said selective etch step and proceeds for a time duration sufficient to fully complete said pattern etching of said metal gate layer for said second region.

15. The method of claim 13, wherein said first etch step proceeds for a time duration sufficient to etch through said metal gate layer for at least a portion of said first region, said second etch step precedes said selective etch step and proceeds for a time duration sufficient to complete said pattern etching of said metal gate layer for said first region and at least a portion of said second region, and said selective etch step proceeds for a time duration sufficient to fully complete said pattern etching of said metal gate layer for said first region and said second region.

16. The method of claim 13, wherein said time duration for said first etch step is determined in-situ using endpoint detection, said time duration for said second etch step is determined prior to performing said second etch step, and said time duration for said selective etch step is determined prior to performing said selective etch step.

17. The method of claim 13, wherein said first etch step utilizes plasma formed of a process composition containing $Cl_2$, said second etch step utilizes plasma formed of a process composition containing $Cl_2$, and said selective etch step utilizes plasma formed of a process composition containing $Cl_2$ and $CHF_3$.

18. The method of claim 17, wherein said process composition in said first etch step, said second etch step, and said selective etch step further include $N_2$ and Ar.

19. A method for performing a differential metal gate etching process, comprising:
disposing a substrate in a plasma processing system, said substrate having a differential metal gate structure including a metal gate layer overlying a high dielectric constant (high-k) dielectric layer, wherein said metal gate layer comprises a first thickness for a first region on said substrate and a second thickness for a second region on said substrate, said second thickness being greater than said first thickness;
performing a differential metal gate etching process for pattern etching said metal gate layer through said first thickness at said first region and said second thickness at said second region using a plurality of etch steps; and
substantially eliminating a footing in said metal gate layer at said second region by introducing an additive gas having C, H, and F as atomic constituents to at least one etch step in said plurality of etch steps.

20. The method of claim 19, further comprising:
substantially eliminating silicon damage to a silicon-containing layer underlying said high-k dielectric layer at said first region.

\* \* \* \* \*